Figure 1:
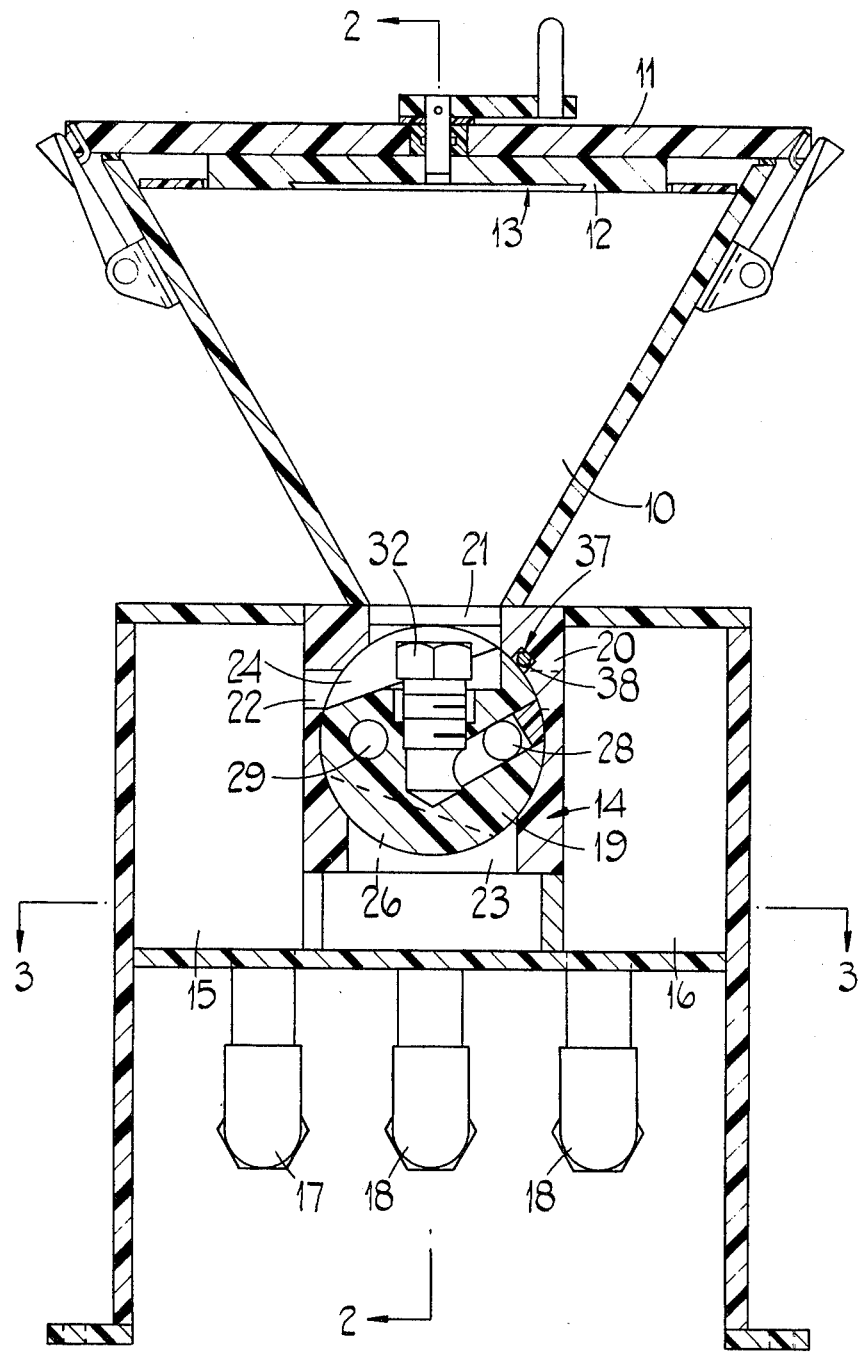

United States Patent
Parramore

[11] 3,933,163
[45] Jan. 20, 1976

[54] SPRAY ETCHING APPARATUS

[75] Inventor: Maurice Parramore, Birmingham, England

[73] Assignee: Lucas Industries Limited, Birmingham, England

[22] Filed: Feb. 4, 1975

[21] Appl. No.: 547,006

[30] Foreign Application Priority Data
Mar. 14, 1974 United Kingdom............... 11418/74

[52] U.S. Cl. .................. 134/96; 134/162; 134/178
[51] Int. Cl.² .......................................... B08B 3/02
[58] Field of Search ............................. 134/94–96, 134/149, 153, 155, 162, 178

[56] References Cited
UNITED STATES PATENTS

| | | | |
|---|---|---|---|
| 2,575,493 | 11/1951 | Hilliker | 134/96 |
| 2,591,080 | 4/1952 | Loeb | 134/178 X |
| 2,963,029 | 12/1960 | Bock | 134/95 X |
| 3,078,861 | 2/1963 | Miller | 134/96 |
| 3,182,671 | 5/1965 | Vorie | 134/162 X |

FOREIGN PATENTS OR APPLICATIONS
140,411   3/1948   Australia............................... 134/94

Primary Examiner—Robert L. Bleutge

[57] ABSTRACT

An apparatus for spray-etching includes a chamber having a surface on which items to be etched can be mounted. A valve has two spray nozzles to which an etchant solution and rinse water respectively are supplied. The valve is movable between a first position in which the etchant spray nozzle is directed at the aforementioned surface and the rinse water nozzle is directed into a water drain well, and a second position in which the rinse water is directed towards the said surface and the etchant nozzle is directed to an etchant drain well. Liquid from the chamber falls into an appropriate one of the drain wells, dependent on the position of the valve. The valve prevents contamination of the etchant by the rinse water.

6 Claims, 3 Drawing Figures

SPRAY ETCHING APPARATUS

This invention relates to spray etching apparatus, and is principally concerned with such apparatus when intended for use in the production of etched film electrical circuits.

It is desirable, in the production of etched film electrical circuits, that the time during which the conductive film shall be exposed to an etchant spray is closely controlled. The time between shutting off the etchant spray and applying a rinsing fluid to the metal film, during which time etchant remains on the film, is preferably to be reduced to a minimum. Moreover, if rinsing fluid is to be introduced substantially immediately after shutting off the supply of etchant, the rinsing fluid must be prevented from draining into the etchant tank.

According to the invention a spray etching apparatus comprises a housing defining a chamber having a surface to which workpieces to be etched may be secured, a valve element movable within said housing and including first and second supply passages for an etchant and a rinsing fluid respectively, first and second spray nozzles mounted on said valve element and respectively communicating with said first and second supply passages, first and second drain wells in said housing, and means for moving said valve element between a first position in which said first nozzle is directed towards said surface, said chamber communicates with said first drain well and is isolated from said second drain well and said second nozzle communicates with said second drain well, and a second position in which said second nozzle is directed towards said surface, said chamber communicates with said second drain well and is isolated from said first drain well, and said first nozzle communicates with said first drain well.

Figure 2:
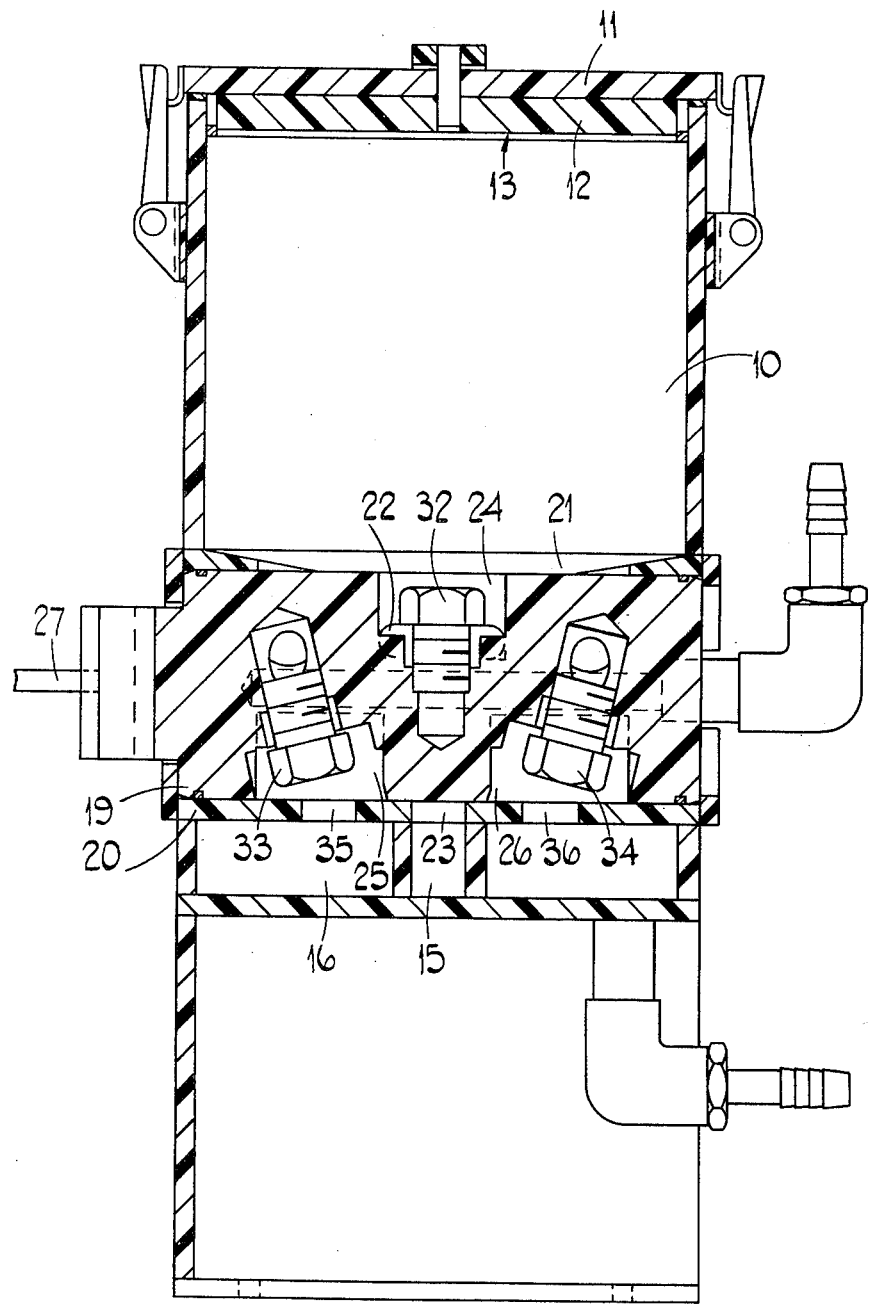
Figure 3:
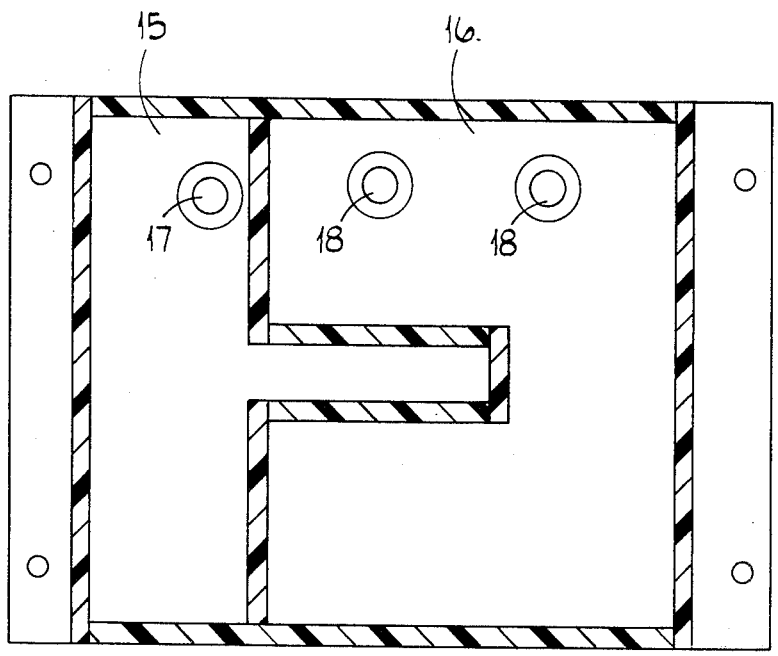

An example of the invention will now be described with reference to the accompanying drawings, in which:

FIG. 1 is a section through a spray etching apparatus,
FIG. 2 is a section on line 2—2 in FIG. 1, and
FIG. 3 is a section on line 3—3 in FIG. 1.

The apparatus has a generally wedge-shaped spray chamber 10 having a removable lid 11 which can be sealingly clipped in place. Mounted on the lid 11 is a rotatable carrier 12 which has its inner surface 13 recessed so as to receive workpieces which are to be etched.

Chamber 10 can communicate, via a valve arrangement 14 with either one of two drain wells 15, 16. In plan, drain well 15 is generally T-shaped and drain well 16 is generally U-shaped. Drain well 15 has a single drain outlet 17 and drain well 16 has two drain outlets 18.

Valve arrangement 14 comprises a generally cylindrical control element 19 which extends sealingly through a housing 20. Housing 20 has a port 21 which communicates with chamber 10, ports 22, 23 which communicate with drain well 15, and ports 35, 36 which communicate with drain well 16. Control element 19 has three recesses 24, 25, 26, and is rotatable through 180° by means of a handle 27 so that in one limiting position chamber 10 communicates with drain well 15 via recess 24, and drain well 16 is isolated from chamber 10. In the other limiting position chamber 10 communicates with drain well 16 via recesses 25, 26, and is isolated from drain well 15.

Extending longitudinally through element 19 are passages 28, 29 having external connections 30, 31 through which an etchant and rinse water can respectively be supplied. Mounted within recess 24 is a spray nozzle 32 which communicates with passage 28 and is arranged to direct etchant through port 21 onto the surface 13 when the control element 19 is in its first limiting position. Mounted within recesses 25, 26 are spray nozzles, 33, 34, both of which communicate with passage 29 and are arranged, when element 19 is in its second limiting position, to direct rinse water through the port 21 onto surface 13.

With control element 19 in the first limiting position (shown) the nozzles 33, 34 direct water through the ports 35, 36 in the housing 20, directly into the drain well 16. With control element 19 in its second limiting position nozzle 32 directs etchant through the port 23 directly into drain well 15.

In use, both etchant and rinse water are constantly supplied to passages 28, 29. During etching control element 19 is in its first limiting position. After a predetermined etching period the control element 19 is moved to its other limiting position, so that rinse water is substantially immediately sprayed onto the workpieces. A small quantity of etchant, mixed with rinse water, enters drain well 16, but no water enters well 15. Well 15 is conveniently connected to an etchant reservoir from which etchant is returned by means of a pump to passage 28.

The carrier 12 is preferably rotated in use to ensure a substantially even distribution of etchant and rinse water over the workpieces. It will be understood that both element 19 and carrier 12 may be automatically operated in response to a timing device.

Preferably the apparatus is fabricated from a synthetic resin material, and there is provided, within an axial groove 37 in the housing 20, an elastomeric seal 38 which prevents leakage flow between drain wells 15, 16 around the circumference of element 19.

I claim:

1. A spray etching apparatus comprising a chamber having a surface to which workpieces to be etched may be secured, a valve element movable within a housing and including first and second supply passages for an etchant and a rinsing fluid respectively, first and second spray nozzles mounted on said valve element and respectively communicating with said first and second supply passages, first and second drain wells in said housing, and means for moving said valve element between a first position in which said first nozzle is directed towards said surface, said chamber communicates with said first drain well and is isolated from said second drain well and said second nozzle communicates with said second drain well, and a second position in which said second nozzle is directed towards said surface, said chamber communicates with said second drain well and is isolated from said first drain well, and said first nozzle communicates with said first drain well.

2. An apparatus as claimed in claim 1 in which said valve element is substantially cylindrical.

3. An apparatus as claimed in claim 2 in which said first and second nozzles are spaced axially of said valve element.

4. An apparatus as claimed in claim 3 in which said first and second nozzles have different radial directions relative to the axis of said valve element.

5. An apparatus as claimed in claim 1 which includes a third spray nozzle communicating with said second supply passage, said third nozzle communicating with said second drain well in said first position of the valve element, and being directed towards said surface in said second position of the control element.

6. An apparatus as claimed in claim 1 in which said valve element is provided with a first recess by means of which, in said first position, said chamber communicates with said first drain well, and in said second position said chamber communicates with said second drain well.

* * * * *